United States Patent [19]
Wacyk

[11] 4,437,024
[45] Mar. 13, 1984

[54] ACTIVELY CONTROLLED INPUT BUFFER

[75] Inventor: Ihor T. Wacyk, Bridgewater, N.J.

[73] Assignee: RCA Corporation, New York, N.Y.

[21] Appl. No.: 313,660

[22] Filed: Oct. 22, 1981

[51] Int. Cl.³ ............... H03K 19/094; H03K 19/017; H03K 17/26; H03K 17/284

[52] U.S. Cl. .................... 307/475; 307/594; 307/270

[58] Field of Search ............. 307/475, 585, 279, 594, 307/595, 576, 579, 270, 264, 451

[56] References Cited

U.S. PATENT DOCUMENTS

| | | | |
|---|---|---|---|
| 3,676,700 | 7/1972 | Buchanan | 307/279 X |
| 3,728,556 | 4/1973 | Arnell | 307/304 X |
| 3,739,194 | 6/1973 | Freeman et al. | 307/304 X |
| 3,755,690 | 8/1973 | Smith | 307/279 X |
| 3,801,831 | 4/1974 | Dame | 307/304 X |
| 3,832,574 | 8/1974 | Leehan | 307/279 X |
| 3,835,457 | 9/1974 | Yu | 307/238 X |
| 3,906,254 | 9/1975 | Lane et al. | 307/279 X |
| 4,039,862 | 8/1977 | Dingwall et al. | 307/279 X |
| 4,080,539 | 3/1978 | Stewart | 307/264 |
| 4,216,390 | 8/1981 | Stewart | 307/264 |
| 4,256,974 | 3/1981 | Padgett et al. | 307/475 |
| 4,268,761 | 5/1981 | Suzuki et al. | 307/475 X |

FOREIGN PATENT DOCUMENTS

| | | | |
|---|---|---|---|
| 54-66763 | 5/1979 | Japan | 307/585 |
| 6112123 | 9/1981 | Japan | 307/475 |

*Primary Examiner*—Larry N. Anagnos
*Assistant Examiner*—David R. Bertelson
*Attorney, Agent, or Firm*—Joseph S. Tripoli; Henry I. Schanzer

[57] ABSTRACT

An interface circuit for producing output signals of first and second levels in response to input signals intermediate said first and second levels. The circuit includes a controllable impedance means, normally set to a high impedance condition, connected in series with a first insulated-gate field-effect transistor (IGFET) between a first power terminal and an output terminal and a second IGFET of complementary conductivity to said first IGFET connected between the output terminal and a second power terminal. In response to an input signal having a value to turn-on the second IGFET, the output terminal is driven to the voltage at the second power terminal and the first IGFET is set to an off condition, conducting at most the current flowing through the controllable impedance means set to its high impedance condition. In response to an input signal of a polarity and magnitude to turn-on the first IGFET and turn-off the second IGFET, a pulse generator coupled between the output terminal and the controllable impedance means momentarily places the controllable impedance means in a relatively low impedance condition and charges the output terminal to the voltage at the first power terminal.

6 Claims, 5 Drawing Figures

ACTIVELY CONTROLLED INPUT BUFFER

This invention relates to an interface circuit operable as a level shift circuit.

The invention is best understood by reference to the accompanying drawing in which like reference characters denote like components and in which.

It is often necessary and/or desirable to operate different parts of an electronic system at different voltage levels. At the places where the different parts interface, they must be coupled to each other. However, the signals at the interfaces are not necessarily compatible. It is, therefore, necessary to provide interface and level shift circuits which can render one part of the system compatible with the other. For an interface or level shift circuit to be useful, it must be compatible with the other circuits of the system with respect, among other things, to speed of operation, and minimization of power dissipation.

Figure 1A:
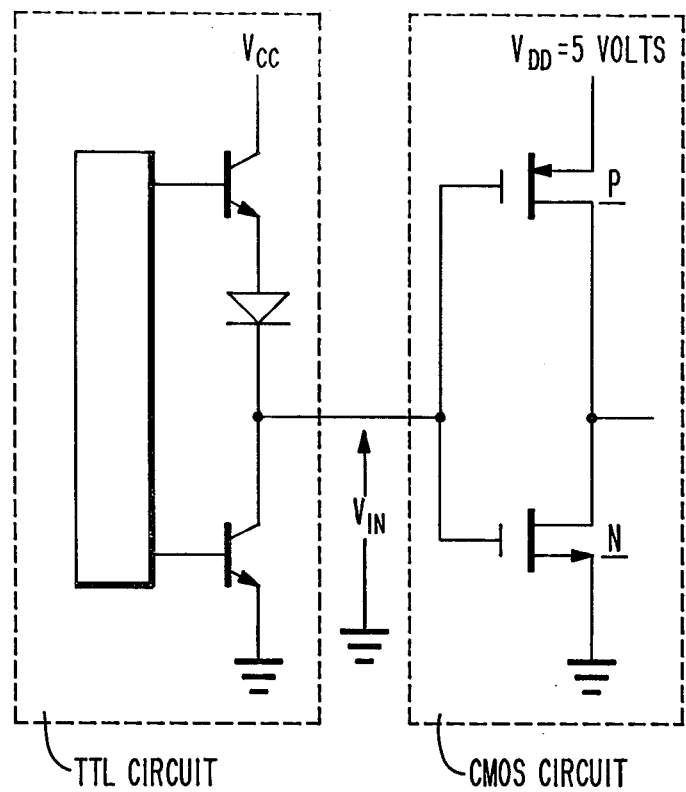
FIG. 1A is a schematic diagram of a prior art circuit.
Figure 1B:
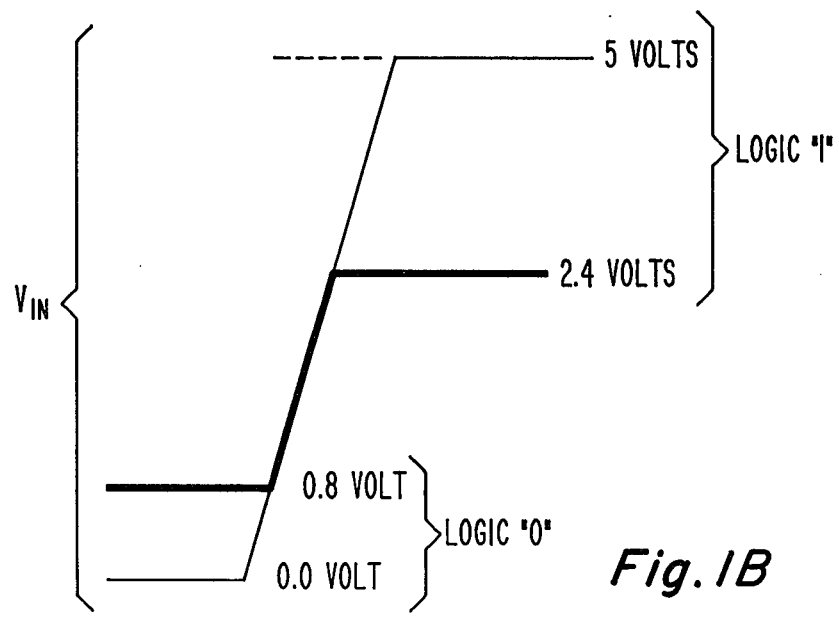
FIG. 1B is a diagram of typical logic levels produced by a Transistor Transistor Logic (TTL) circuit.

By way of example, a problem which exists in interfacing the output signal of a Transistor Transistor Logic (TTL) circuit to the input of a Complementary Metal Oxide Semiconductor (CMOS) circuit is best illustrated by reference to FIG. 1A. The logic "1" or "high" level output of the TTL signal denoted as $V_{IN}$ ranges, as shown in FIG. 1B, from approximately 2.4 volts to 5 volts, and the logic "0" or "low" level ranges from 0 volt to 0.8 volt. The worst case condition for distinguishing between the "high" and "low" TTL output levels may be defined as 2.4 volts for the "high" level and 0.8 volt for the "low" level.

In CMOS circuits it is conventional to have an input buffer comprised of series connected P-channel and N-channel insulated-gate field-effect transistors (IGFETs) forming a "complementary inverter". Where the operating voltage ($V_{DD}$) to the CMOS circuit is, for example, 5 volts, the desired logic "1" and "0" signal should be close to 5 volts and 0 volts, respectively, to ensure that when one of the two IGFETs is turned-on the other one is turned-off. However, where the "highest" $V_{IN}$ is 2.4 volts a problem exists because both the P and the N channel IGFETs are turned-on simultaneously resulting in a relatively low impedance path between $V_{DD}$ and ground and an unacceptably high power dissipation level. Further, the output level is undefined, being somewhere between $V_{DD}$ and ground. To avoid these problems and to assure stable switching states at the 0.8 volt and 2.4 volts input levels, the prior art teaches making the impedance of the P-channel IGFET much larger (typically at least 10 times greater) than the impedance of the N-channel IGFET when both are conducting; i.e., the size of the N-IGFET is made much larger than that of the P-IGFET. The larger "skew" of the input inverter enables the output to be defined for TTL inputs but leads to many other problems.

First, for full rail-to-rail input signals (0–5 volts) where skewing of the input buffer is not required, the response of the input buffer is rendered highly asymmetrical. The very small drive capability of the P-IGFET (compared to the N-IGFET) results in greatly increased delays for input signal transitions of one polarity (e.g. 2.4 volt to 0.8 volt) compared to those of opposite polarity. The circuit response is therefore delayed in one direction and the circuit operation is severely degraded.

Another problem is the high power dissipation of the inverter in response to TTL level inputs. A major advantage of CMOS technology is its low standby power dissipation, (e.g. microwatts). However, the low power dissipation is specified only with full rail-to-rail CMOS input levels. The static power with TTL levels can be orders of magnitude higher—in the milliwatt range. Increasing the impedance of the P and N channel devices decreases the power dissipation but is not tolerable in high speed circuits, since the impedance of the P devices would have to be made so much larger than that of the N device. On the other hand, increasing the size of the devices (decreasing their impedance) reduces delays but aggravates the power dissipation problem. Also, the requirement for a large geometry N IGFET compared to the P-IGFET presents problems in the layout and fabrication of the circuit.

In circuits embodying the invention, dependence on the ratio of the P-IGFET to the N-IGFET is reduced. This is accomplished, for example, by ensuring that the P-IGFET is either fully off or driven to a high impedance state when the N-IGFET is turned-on and by applying a power pulse to the P-IGFET when the N-IGFET is turned-off.

Figure 2:
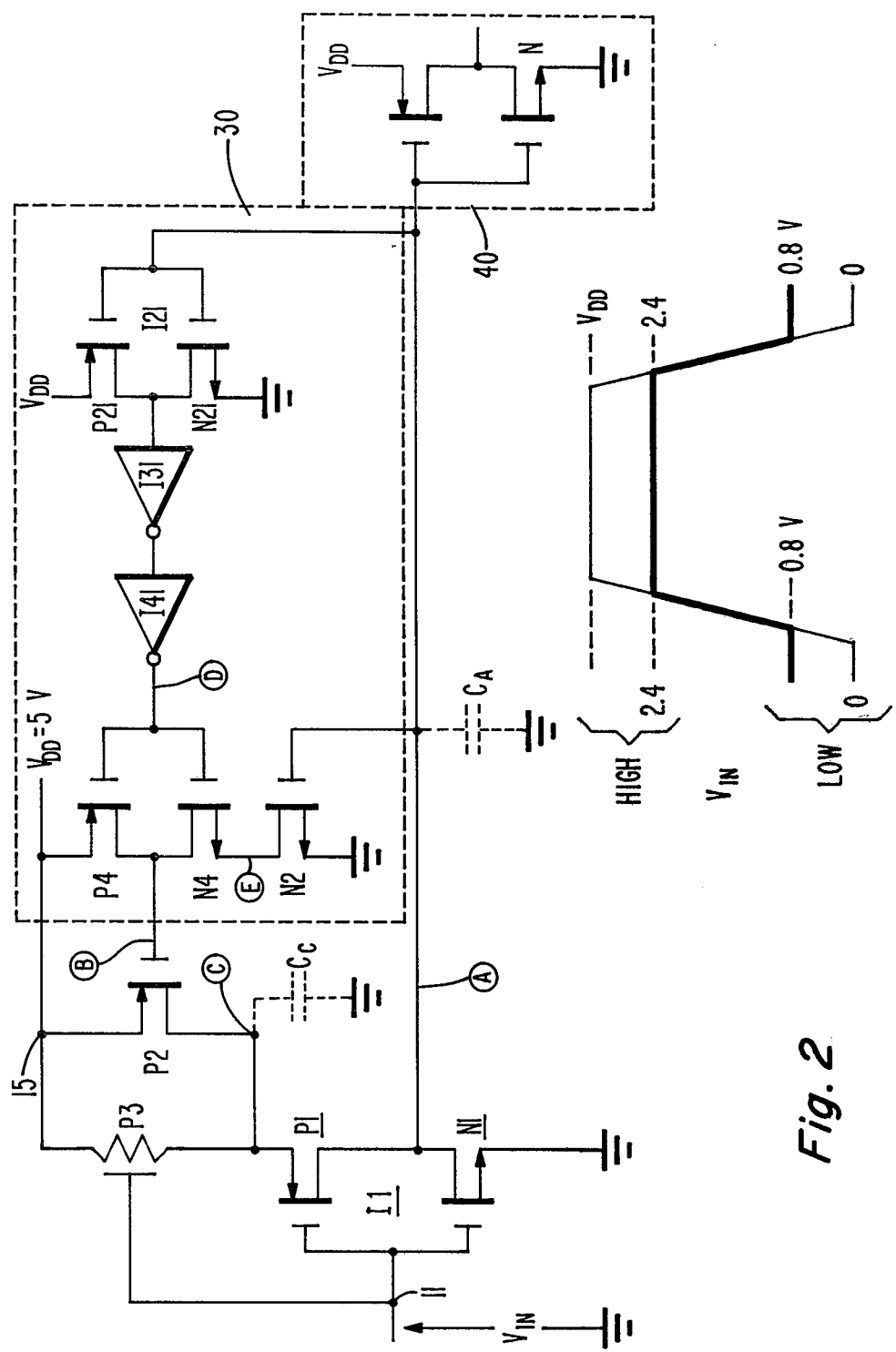
FIG. 2 is a schematic diagram of a circuit embodying the invention.

An input buffer embodying the invention, shown in FIG. 2, includes a first IGFET having its conduction path connected in series with a controllable impedance means between an output terminal and a first point of operating potential and a second IGFET connected between the output terminal and a second point of operating potential. The controllable impedance normally has a relatively high impedance value. A pulse network is connected between the output terminal and the controllable impedance for momentarily placing the controllable impedance means in a relatively low impedance condition whenever the first IGFET is driven from the off to the on condition.

In more detail, the circuit of FIG. 2 includes an input terminal 11 to which is applied an input signal $V_{IN}$ from a TTL source (not shown). $V_{IN}$ may vary as shown in the FIGURE from a "low" condition which ranges between 0 volt and 0.8 volt and a "high" condition which ranges between 2.4 volts and $V_{DD}$ volts, which, in this application, is assumed equal to +5 volts.

The input buffer I1 is comprised of IGFETs P1 and N1 whose gate electrodes are connected to node 11 and whose drains are connected to node A which also defines the output node of the circuit. Node A is connected to an output load 40 which includes the gate electrodes of one or more IGFETs. The loading on node A is a high impedance, primarily capacitive load. Capacitor $C_A$ represents the total capacitance associated with node A. The source of N1 is returned to ground while the source of P1 is connected to a node C. The total nodal capacitance at node C is represented by a capacitor $C_C$ which is assumed to be significantly greater than $C_A$.

The condition paths of two IGFETs, P2 and P3, are connected in parallel between node C and a power terminal 15 receptive of an operating voltage of $V_{DD}$ volts, assumed herein to be 5 volts. The gate electrode of P3 is connected to input terminal 11. P3 is drawn with a resistive symbol in its conduction path to indicate that it is an extremely high impedance (very small geometry) device. As described below, P3 is designed to pass sufficient current to compensate for the leakage currents associated with capacitors $C_C$ and $C_A$. A pulse network 30 is connected at it's input to output terminal A and at it's output, denoted as node B, to the gate electrode of P2. Network 30 includes an odd number of inverters (I21, I31, and I41), normally of the same kind, connected in cascade between nodes A and D. The inverters may all be complementary inverters, as illustrated for I21, but may be, instead, any one of a number of known high input impedance inverters.

Inverters I21, I31, and I41 function to produce a signal at node D which is the inverse of the signal at node A but which is delayed with respect to the signal at node A due to the propagation delays through the inverters. The output of inverter I41, denoted as node D, is connected to the gate electrodes of IGFETs P4 and N4 whose drains are connected at node B to the gate electrode of P2. The source of P4 is connected to $V_{DD}$ (terminal 15) while the source of N4 is connected to a node E. The conduction path of an IGFET N2 is connected between node E and ground and its gate electrode is connected to node A. As detailed below, node B will be pulled to ground potential and P2 will be turned on only when N4 and N2 are both turned-on.

The operation of the circuit of FIG. 2 will be examined for the condition when the input signal ($V_{IN}$) is "low" (between 0 volt and 0.8 volt), then for the condition when $V_{IN}$ makes a transition from low to "high" (a minimum of 2.4 volts), then for the condition when $V_{IN}$ is high, and finally for the condition when $V_{IN}$ makes a transistion from high to low.

(a) when $V_{IN}$ is at or below 0.8 volt, N1 is turned-off and P1 and P3 are turned-on. P3 is a very high impedance device, but its impedance, although high, is low enough to enable it to supply the leakage currents flowing out of nodes A and C to maintain these nodes charged to, or close to, $V_{DD}$ volts. As noted above, node A is assumed to be a high impedance capacitive output node and $C_C$ is assumed equal to $10C_A$. With P3 and P1 ON, node C and, capacitor $C_C$ are charged to $V_{DD}$ (+5 volts), and likewise node A and $C_A$ are at 5 volts.

With node A at +5 volts, the output of inverter I21 is low, causing the output of inverter I31 to be high and the output of inverter I41 to be low. The low at node D causes P4 to turn-on and causes N4 to be turned-off. P4-ON charges node B to $+V_{DD}$ causing P2 to be turned-off. Although P2 is turned-off, P3 conducts sufficient current to maintain nodes C and A at, or close to $V_{DD}$. Thus, with $V_{IN}$ low at, or below, 0.8 volt and with the CMOS circuit operated at 5 volts there is very little power dissipation in the input buffer. For $V_{IN}$ "low" the condition of nodes A, B and C being high and node E being low are shown for time $t_0$ in FIG. 3.

Figure 3:
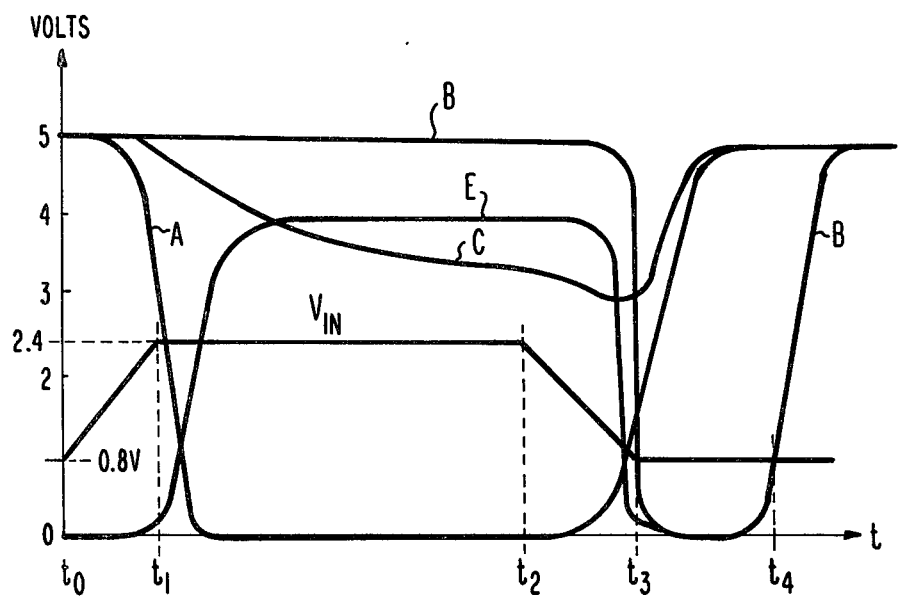
FIG. 3 is a diagram of waveforms at various nodes of the circuit of FIG. 2.

(b) When $V_{IN}$ makes a transition from the "low" level to 2.4 volts, transistor N1 is turned-on and the output voltage at node A very quickly goes from 5 volts to ground as shown following time $t_1$ in FIG. 3. When $V_{IN}$ goes from 0.8 volt to 2.4 volts, P1 although still turned on, is turned-on less since its gate-to-source potential is decreased from a maximum of 4.2 volts to a maximum of 2.6 volts [assuming node C to be charged to +5 volts]. N1 which is turned-on can pass a relatively large current causing capacitances $C_A$ and $C_C$ at nodes A and C, respectively, to discharge. With $V_{IN}$ at 2.4 volts P3 is still conducting since its $V_{GS}$ is 2.6 volts but as noted before it can only pass a very low amplitude current. As capacitor $C_C$ discharges the potential ($V_C$) at the source of P1 decreases with respect to the potential ($V_{IN}$) at its gate. In this mode, P1 functions as a source follower and its conductivity decreases more and more as $V_C$ decreases. Assuming the threshold voltage ($V_T$) of P1 to be equal to 1 volt, P1 turns off when the voltage at node C reaches 3.4 volts. When node C is discharged to approximately 3.4 volts P1 turns off and node C no longer discharges, except for leakage. This is shown for waveform C in FIG. 3 after time $t_1$. As noted below, the limited discharge of node C results in limited power dissipation. With P1 turned-off and with N1 turned-on, node A is quickly discharged to ground. [Via the low impedance path of N1]. As soon as the voltage at node A drops below 1 volt, N2 is turned off and node B cannot be discharged to ground; rather, the high at node B is maintained. Concurrently, the high to low transition at node A is propagated with a delay via inverters I21, I31, and I41. Assuming each inverter to have a given time delay (for example, 3 nanoseconds) the signal at node D will make a low to high (positive going) transition 3 time delays (e.g. 9 nanoseconds) after the negative going transition at node A. The high at node D turns-off P4 and turns on N4. However, since N2 is turned-off, the voltage at node B remains high and P2 remains off. The potential developed at node E will depend on the ratio of the capacitance at node E to that at node B. Since the nodal capacitance at node E is much less than that at node B, node B remains at or close to $V_{DD}$ and node E will be charged to around 4 volts as shown in FIG. 3. Therefore, even with a $V_{IN}$ of 2.4 volts P1 is turned off once the voltage at node C decreases below 3.4 volts. Power dissipation in the input circuit (P1, N1) is drastically reduced since there is only some trickle current through P3 which maintains a DC level on capacitor $C_C$ of 2.4 volts $+V_T$ of P1.

(c) When $V_{IN}$ is at 2.4 volts (or more) P1 is effectively off, N1 is on, node A is at, or close to, ground potential, node D is at, or close to $V_{DD}$, N2 is off and node E is charged to a relatively high level, N4 is on so that node B is at or close to $V_{DD}$ (close to the level at E), and node C is at [$V_{IN}+V_T$ of P1] volts.

(d) When $V_{IN}$ makes a negative going transition from 2.4 volts to a low of 0.8 volt P1 is turned-on and N1 is turned-off. The turn-off of N1 cuts off the discharge path between node A and ground. The turn-on of P1 provides a low impedance path to discharge capacitor $C_C$ into capacitor $C_A$. Assuming $C_C$ to be 10 times $C_A$, the voltage produced at node A rises quickly (above the 1 volt level which is assumed to be the $V_T$ of N2) turning-on N2. Since N4 is also turned-on due to the high at node D, N2 and N4 now provide a low impedance path between node B and ground discharging node B to ground and holding node B at ground for a time $t_3$ to $t_4$ as shown in FIG. 3. The "low" at node B turns-on P2 which conducts in the common source mode and charges node C and capacitor $C_C$ to $V_{DD}$ volts via its relatively low impedance path. The source of P1 is now also coupled via P2 to $V_{DD}$ and P1 is turned-on hard charging node A quickly all the way to, or close to, $V_{DD}$ as shown for waveform A after time $t_3$. Concurrently, the low to high transition at node A is propagated via inverters I21, I31 and I41 producing a high to low transition at node D, three time delays after $V_A$ went to $V_{DD}$. The low at node D turns-on P4 and turns-off N4. The turn-off of N4 disconnects node B from ground while the turn-on of P4 clamps node B to $V_{DD}$, turning-off P2. Thus, pulse network 30 produces a negative-going pulse (in response to a positive going transition at node A) which turns P2 on (for time $t_3$ to $t_4$) and causes $C_C$ and $C_A$ to be charged to $V_{DD}$ very quickly via the low impedance path of P2. Following the termination of the pulse, B returns to $V_{DD}$ and P2 is turned-off. $C_C$ is charged to $V_{DD}$ and after P2 turns off it remains charged to that level via P3. Since the load on node A is primarily capacitive, P3 must supply only the leakage current necessary to maintain capacitances $C_A$ and $C_C$ charged to $V_{DD}$ volts.

Thus network 30, which is the combination of inverters, I21, I31, and I41 and components P4, N4 and N2, function as a positive transition detector, or positive going edge trigger pulse generator. The combination turns on P2 for a period of time which is sufficiently long to bring nodes A and C to $V_{DD}$. Once the nodes A and C are charged to $V_{DD}$ there is very little static power dissipation. Network 30 may be replaced by any suitable circuit which produces a negative pulse at B (or a positive pulse at C) in response to a negative (high-to-low) going transition at node A.

It has thus been shown that node A can be quickly charged to $V_{DD}$ and quickly discharged to ground even where the maximum $V_{IN}$ of 2.4 volts, is approximately one half of $V_{DD}$. This can be achieved without an asymmetrical design. That is, P1 and N1 can be of comparable geometries, hence of comparable impedance when subjected to like bias conditions. Significant features of the circuit in accomplishing this goal are:

(a) The normally high impedance connection in series with the source of P1 ensures that, when N1 is turned-on and conducting a relatively high current, P1 conducts in the source follower mode eventually turning off (except for the leakage level current through the high impedance connection); and (b) the pulsed low impedance connection (P2) in series with the source of P1 ensures that a high current can flow through P1 recharging the capacitive nodes at the source (node C) and drain (node A) of P1, when P1 is first turned on.

In one design the ratio of the sizes of the various transistors to each other were as follows:

$$P1=N1=[\tfrac{3}{2}] P2=100 \cdot P3=[2.5] P4=[5/3] N4=[4/3] \cdot N2$$

Also, although not critical to the design, inverters I21, I31 and I41 were skewed such that the response at node D would be slower for positive going transition than for negative going transitions at node A.

Figure 4:
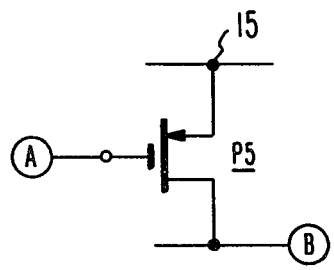
FIG. 4 depicts the addition of a transistor P5 to modify the circuit of FIG. 2.

The circuit of FIG. 2 may be modified as shown in FIG. 4 by the addition of a transistor P5 having its conduction path connected between $V_{DD}$ terminal 15 and node B and having its gate electrode connected to node A. P5 functions to clamp node B to $V_{DD}$ and to turn-off P2 if $V_{IN}$ makes a positive going transition so quickly after having made a negative going transition that P4 has not yet turned-on and N4 has not yet turned-off. In the absence of P5, the turn on of P4 and turn off of N4 could be aborted with node B remaining discharged at ground. P5 ensures that when node A goes low that P2 is eventually turned off. P5 is designed to be a smaller device than P4 to ensure that the negative pulse at node B between times $t_3$ and $t_4$ is always long enough to recharge nodes A and C.

The operation of the circuits of FIGS. 2 and 4 has been discussed for the conditions when $V_{IN}$ makes transitions between 0.8 volt and 2.4 volts (i.e. the worst case, TTL input levels). For these voltage swings the response of the circuits is generally symmetrical and the circuits dissipate very little power. It should be evident that for input levels swinging between 0 and 5 volts the circuit response is even better.

What is claimed is:

1. The combination comprising:
    first and second IGFETs of complementary conductivity type, each IGFET having source and drain electrodes defining the ends of a conduction path and a control electrode;
    a signal input terminal, a signal output terminal, and first and second power terminals for the application therebetween of an operating potential;
    means connecting the control electrodes of said first and second IGFETs to said signal input terminal;
    means connecting the drain electrodes of said first and second IGFETs to said signal output terminal;
    a controllable impedance means connected between said source of said first IGFET and said first power terminal, said controllable impedance means normally providing a relatively high impedance path when said first IGFET is turned on;
    means connecting said source of said second IGFET to said second power terminal; and
    pulse generating means coupled between said signal output terminal and said controllable impedance means for momentarily placing said controllable impedance means in a relatively low impedance condition in response to said first IGFET being driven from an OFF to an ON condition.

2. The combination as claimed in claim 1 wherein said controllable impedance means includes third and fourth IGFETs, of same conductivity type as said first IGFET, having their conduction paths connected in parallel between the source of said first IGFET and said first power terminal, said third IGFET being a relatively small geometry device of relatively high impedance when turned-on, with its gate electrode connected to said signal input terminal, and said fourth IGFET being a relatively large geometry, relatively low impedance device when turned on, and
    wherein said pulse generating means is connected at it's output to the control electrode of said fourth IGFET.

3. The combination as claimed in claim 2 further including means for applying first and second voltages to said first and second power terminals, respectively, and said signal input terminal being receptive to binary input signals one binary condition having a wide range of values between said first and second voltages.

4. The combination as claimed in claim 3 wherein said pulse generating means includes:
    (a) a fifth IGFET of first conductivity type and sixth and seventh IGFETs of second conductivity type, wherein the conduction path of said fifth IGFET is connected between said first power terminal and the control electrode of said fourth IGFET, wherein the conduction paths of said sixth and sevenths IGFETs are connected in series between the control electrode of said fourth IGFET and said second power terminal;

(b) N inverters connected in cascade, where N is an odd number, the input of the first inverter being connected to said signal output terminal and the output of the Nth inverter being connected to the control electrodes of said fifth and sixth IGFETs; and (c) means connecting said signal output terminal to the control electrode of said seventh IGFET.

5. The combination as claimed in claim 1 wherein said signal output terminal is characterized as high impedance capacitive node, and wherein the capacitance at the source of said first IGFET is substantially greater than the capacitance at said signal output terminal.

6. The combination as claimed in claim 1 wherein said first and second IGFETs are of comparable impedance under like turn-on conditions.

* * * * *